United States Patent
Lee et al.

(10) Patent No.: US 10,600,990 B2
(45) Date of Patent: Mar. 24, 2020

(54) DISPLAY DEVICE WITH RESIN LAYER AND IMPROVED COOLING

(71) Applicant: LG Display Co., Ltd., Seoul (KR)

(72) Inventors: Hyo-Sung Lee, Gwangmyeong-si (KR); Heong-Soo Park, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/104,010

(22) Filed: Aug. 16, 2018

(65) Prior Publication Data
US 2019/0058149 A1    Feb. 21, 2019

(30) Foreign Application Priority Data
Aug. 16, 2017    (KR) .......................... 10-2017-0103416

(51) Int. Cl.
| H01L 51/52 | (2006.01) |
| G06F 1/16 | (2006.01) |
| H05K 7/20 | (2006.01) |
| H05K 5/00 | (2006.01) |
| H01L 27/32 | (2006.01) |

(52) U.S. Cl.
CPC .......... H01L 51/524 (2013.01); G06F 1/1601 (2013.01); H01L 27/3276 (2013.01); H01L 51/529 (2013.01); H05K 5/0017 (2013.01); H05K 7/20472 (2013.01); H05K 7/20963 (2013.01); *H01L 51/5246* (2013.01); *H05K 7/20481* (2013.01)

(58) Field of Classification Search
CPC . H01L 51/524; H01L 51/529; H01L 27/3276; H05K 5/0017; H05K 5/03; H05K 7/20963

USPC ................................................... 361/704–713
See application file for complete search history.

(56) References Cited

U.S. PATENT DOCUMENTS

| 7,667,964 B2* | 2/2010 | Kang ................ G02F 1/133308 313/582 |
| 8,970,805 B2* | 3/2015 | Kim .................. G02F 1/133308 349/122 |
| 9,049,804 B2* | 6/2015 | Lang ................... H05K 7/20963 |
| 9,128,314 B2* | 9/2015 | Yoon ................. G02F 1/133308 |
| 9,341,874 B2* | 5/2016 | Jeong ............... G02F 1/133308 |
| 9,947,652 B2* | 4/2018 | Choi .................... H01L 27/3276 |
| 2002/0014840 A1* | 2/2002 | Kaneko ............. H05K 7/20963 313/587 |
| 2013/0263488 A1* | 10/2013 | Wu ...................... G02B 6/0088 40/773 |
| 2016/0183415 A1* | 6/2016 | Kim ..................... G09G 3/3208 345/205 |

(Continued)

*Primary Examiner* — Zachary Pape
(74) *Attorney, Agent, or Firm* — Fenwick & West LLP

(57) ABSTRACT

A display device includes a display panel and a back cover coupled and fixed to each other via a resin layer to manufacture a lightweight, thin display device having a slim bezel while increasing the drooping resistance of the display device. In addition, since the drooping resistance of the display device is increased, it is possible to reduce the thickness of the back cover, whereby it is possible to further reduce the weight of the display device. Furthermore, a through-hole is formed in a cover shield such that a portion of the upper part of an IC chip of a substrate can be inserted into the through-hole, with the result that the coupling structure of a circuit unit is improved, whereby it is possible to further reduce the thickness of the display device.

9 Claims, 6 Drawing Sheets

(56) References Cited

U.S. PATENT DOCUMENTS

2017/0218236 A1* 8/2017 Matsukawa ............ C09J 163/00

* cited by examiner (a)  (b)

(a)  (b)

(a)

(b)

DISPLAY DEVICE WITH RESIN LAYER AND IMPROVED COOLING

CROSS REFERENCE TO RELATED APPLICATION

This application claims the benefit of Korean Patent Application No. 10-2017-0103416, filed on Aug. 16, 2017, which is hereby incorporated by reference as if fully set forth herein.

BACKGROUND

Field

Embodiments of the present disclosure relates to a display device that can be manufactured so as to have a lightweight and thin structure, increased resistance to drooping, and improved heat dissipation efficiency.

Discussion of the Related Art

Image display devices, which are a core technology in the information and communication age and serve to display various kinds of information on a screen, have been developed such that the image display devices are increasingly thin, lightweight, and portable and exhibit high performance. In addition, organic light-emitting display (OLED) devices, which control the amount of light that is emitted from an organic light-emitting layer to display an image, have been highlighted as flat panel display devices, which have lower weight and volume than cathode ray tubes (CRT). Such organic light-emitting display devices, which are self-emissive display devices, exhibit low power consumption, a high response speed, high light emission efficiency, high luminance, and a wide viewing angle.

In an organic light-emitting display device, a plurality of subpixels is arranged in the form of a matrix to display images. Each subpixel includes a light-emitting device and a pixel-driving circuit including a plurality of transistors configured to independently drive the light-emitting device.

In recent years, research has been actively conducted into an organic light-emitting display device including a semiconductor film.

Since the organic light-emitting layer of the organic light-emitting display (OLED) device, which is self-emissive, is transparent, it is possible to realize an organic light-emitting display device using transparent electrodes as electrodes disposed at opposite sides thereof. Electrons and holes are injected into the organic light-emitting display device from the opposite sides thereof such that the electrons and holes are combined with each other in the organic light-emitting layer in order to emit light. In the organic light-emitting display device, therefore, the electrons and holes are injected at a desired position in the organic light-emitting layer using the above-described principle in order to display information.

The size of the organic light-emitting display device has continuously increased to a large size. According to the trend of increasing the size of the organic light-emitting display device, research has been conducted into a thinner and lighter product. However, the extent to which the thickness of a display panel or a back cover can be reduced is limited, and moreover it is difficult to improve the heat dissipation performance of a thin and lightweight product.

SUMMARY

Accordingly, embodiments of the present disclosure is directed to a display device that substantially obviates one or more problems due to limitations and disadvantages of the related art.

An object of the present disclosure is to provide a display device configured such that drooping of the display device is prevented, the thickness of a circuit unit is reduced, and efficiency of heat dissipation from the circuit unit is improved, whereby the expected lifespan of the display device is increased.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display device includes a display panel, a back cover, and a resin layer for coupling and fixing the back cover and the display panel to each other.

In a circuit unit for driving the display panel, a cover shield may be provided with a through-hole, through which the upper part of an IC chip extends, whereby it is possible to reduce the thickness of the circuit unit and to increase the drooping resistance of the display panel by the provision of the resin layer. As a result, it is also possible to reduce the thickness of the back cover, whereby it is possible to provide a lightweight and thin display device.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
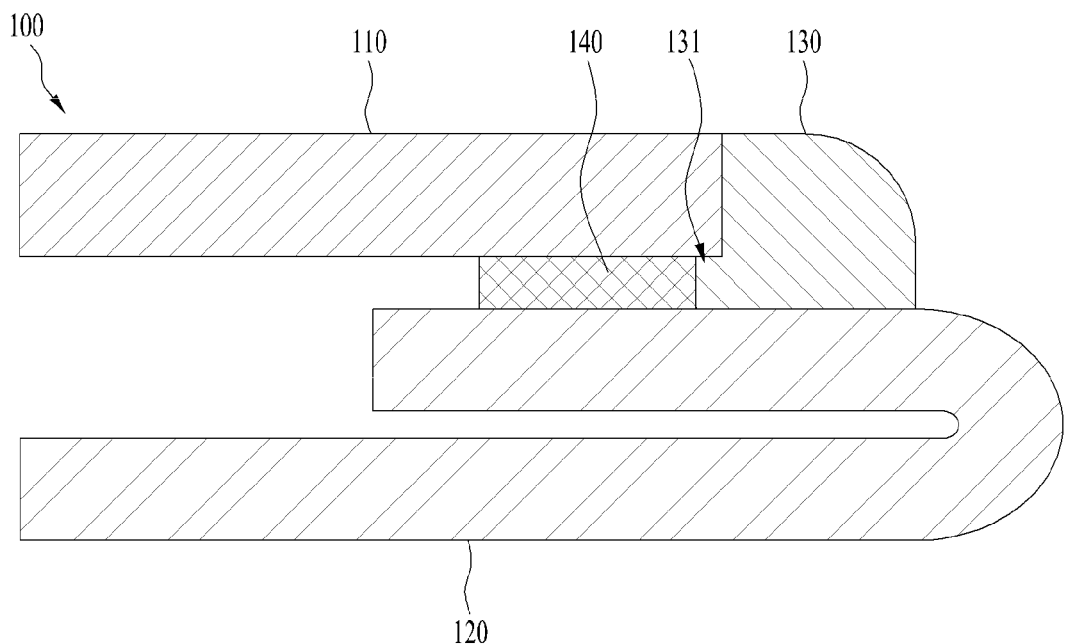
FIGS. 1, 2, 3, and 4 are sectional views showing a portion of the side surface of a display device according to an embodiment of the present disclosure.

Hereinafter, exemplary embodiments of an organic light-emitting display device according to the present disclosure will be described in detail with reference to the accompanying drawings so that the present disclosure will be easily realized by those skilled in the art. In the drawings, the same elements are denoted by the same reference numerals even when they are depicted in different drawings. In the following description of the present disclosure, a detailed description of known functions and configurations incorporated herein will be omitted when the same may obscure the subject matter of the present disclosure. Those skilled in the art will appreciate that some features in the drawings may be exaggerated, reduced, or simplified for ease of description thereof, and that the drawings and elements therein are not always shown at the actual scale.

FIGS. 1, 2, 3, and 4 are sectional views showing a portion of the side surface of a display device according to an embodiment of the present disclosure.

Referring to FIG. 1, a display device 100 according to an embodiment of the present disclosure includes a display panel 110, a back cover 120, and a resin layer 130.

In addition, the display device 100 further includes a gate driver (not shown), a data driver (not shown), a timing controller (not shown), and a power supply unit (not shown).

The display panel 110 displays an image through a pixel array in which subpixels are arranged in a matrix form. A basic pixel may include at least three subpixels that are capable of expressing white through combination thereof, e.g. at least three of a white (W), red (R), green (G), or blue (B) subpixel. For example, the basic pixel may include a combination of R, G, and B subpixels, a combination of W, R, and G subpixels, a combination of B, W, and R subpixels, a combination of G, B, and W subpixels, or a combination of W, R, G, and B subpixels.

The power supply unit generates and outputs various drive voltages necessary for components of the display device, such as the timing controller, the gate driver, the data driver, and the display panel. For example, the power supply unit generates and outputs drive voltage for a digital circuit that is supplied to the data driver and the timing controller, drive voltage for an analog circuit that is supplied to the data driver, and gate on voltage (gate high voltage) and gate off voltage (gate low voltage) that are used in the gate driver. The power supply unit generates a plurality of drive voltages EVDD and EVSS necessary to drive the display panel 110 and reference voltage, and supplies the generated voltages to the display panel 110 through the data driver.

The timing controller receives image data and basic timing control signals from an external system. The system may be one of a TV system, a set-top box, a tablet, and a portable terminal such as a mobile phone. The basic timing control signals may include a dot clock, a data enable signal, a vertical synchronization signal, and a horizontal synchronization signal.

The timing controller generates and supplies data control signals and gate control signals for controlling drive timing of the data driver and the gate driver, respectively, using the basic timing control signals received from the outside and timing setting information stored in an internal register (start timing, a pulse width, etc.).

The back cover 120 is coupled to the rear surface of the display panel 110 in order to define the rear surface of the display device 100.

As shown in FIG. 1, the resin layer 130 is provided at the edges of the display panel 110 and at the edges of the back cover 120 in order to couple and fix the display panel 110 and the back cover 120 to each other.

The resin layer 130 may be applied in consideration of viscosity, color, hardness, and adhesion force. In addition, an ultraviolet (UV) resin or a dual resin may be selectively applied as the resin layer 130 depending on the hardening characteristics thereof.

In addition, the resin layer 130 is applied along the four edges of the display device 100. Tilt dispensing, in which resin is supplied in a direction inclined at a predetermined angle, or vertical dispensing, in which resin is supplied vertically from above, is selectively applied.

Furthermore, the resin layer 130 may have any of various colors. Consequently, a resin layer 130 having an appropriate color may be applied in consideration of the color of the display panel 110 or the display device 100 or in consideration of the interior environment.

Between the display panel 110 and the back cover 120 is provided a foam pad or an adhesive layer 140 for preventing direct contact therebetween. Of course, the foam pad or the adhesive layer 140 may be selectively used or omitted.

The resin layer 130 is applied along the four edges of the display panel 110 so as to be adjacent to the side edge of the display panel and the top surface of the back cover 120. The applied resin layer 130 may simultaneously fix the side surface of the display panel 110 and the top surface of the back cover 120, whereby the drooping resistance of the display panel 110 may be remarkably increased.

In addition, as shown in FIG. 1, a portion of the resin layer 130 is introduced into a space in which the bottom surface of the display panel 110 and the top surface of the back cover 120 overlap each other, whereby a step part 131 is provided. The step part 131 may define a predetermined distance between the display panel 110 and the back cover 120 in order to enable the foam pad or the adhesive layer 140 to function properly. In addition, the step part 131 increases the total area of adhesion of the resin layer 130, whereby the drooping resistance of the display panel 110 is further increased.

The resin layer 130 may have a height that is at least equal to or higher than the height of the top surface of the display panel 110. The reason for this is that it is necessary to protect a user from a safety-related accident in the case in which the side edge of the display panel 110 is higher. In addition, the resin layer 130 may be formed so as to be higher than the top surface of the display panel 110, whereby the resin layer may function to protect the side edge of the display panel 110. Of course, the height of the top surface of the display panel may be higher than the height of the resin layer 130 within an error range of assembly tolerance.

Figure 2:
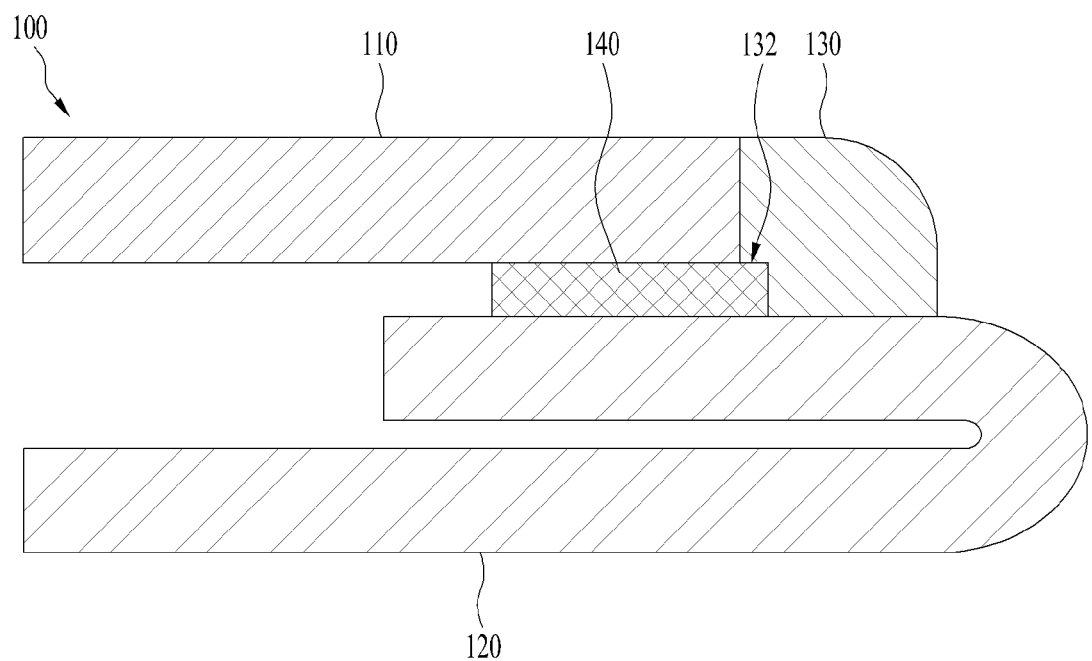

In addition, as in another embodiment shown in FIG. 2, the resin layer 130 may have a fault part 132 that is bent inwards between the display panel 110 and the back cover 120. The fault part 132 is a part that is bent at least once. When a portion of the foam pad or the adhesive layer 140 is introduced into the fault part 132, the foam pad or the adhesive layer 14 may function properly. For example, the foam pad may absorb shocks between the display panel 110 and the back cover 120, or the adhesive layer may provide adhesion force between the display panel 110 and the back cover 120.

Figure 3:
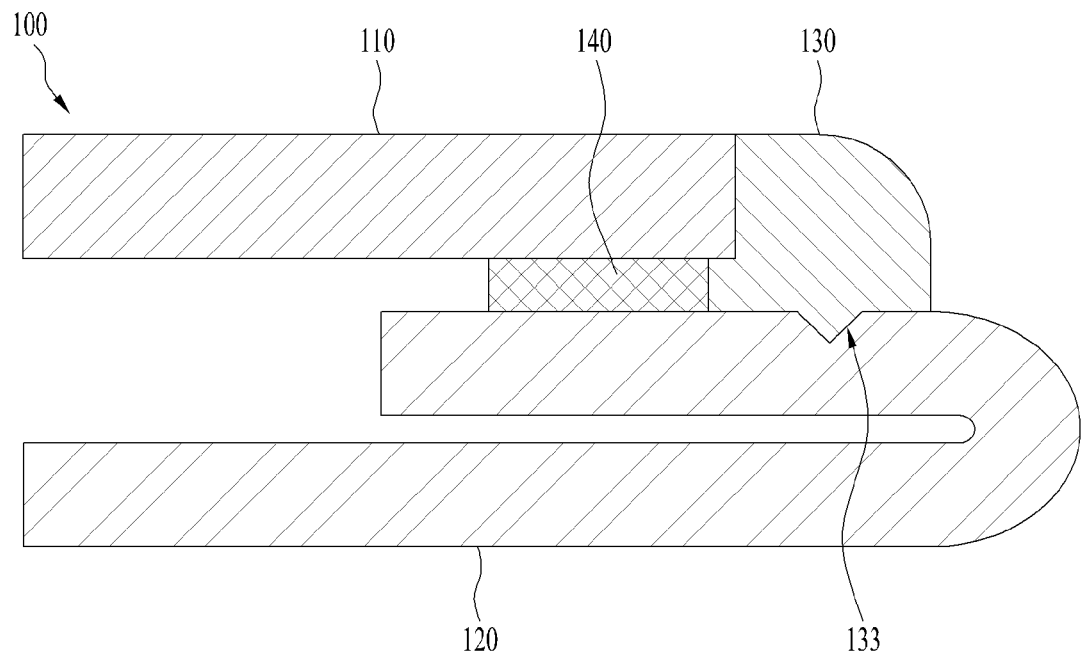

In addition, as in another embodiment shown in FIG. 3, the back cover 120 may be provided in the surface thereof to which the resin layer 130 is applied with an application groove 133. A portion of the resin layer 130 is introduced into the application groove 133 formed in the back cover 120, whereby the attachment area between the back cover 120 and the resin layer may be increased and fixing force may therefore be increased. In addition, since the fixing force of the resin layer 130 is increased, the drooping resistance of the display panel 110 is further increased. The figure shows an example in which a single application groove 133 is formed so as to have a triangular section. However, the application groove 133 is not limited as to the number and shape thereof. A plurality of application grooves may be provided, and the shape of the application groove may be modified to increase the fixing force of the display panel 110.

Figure 4:
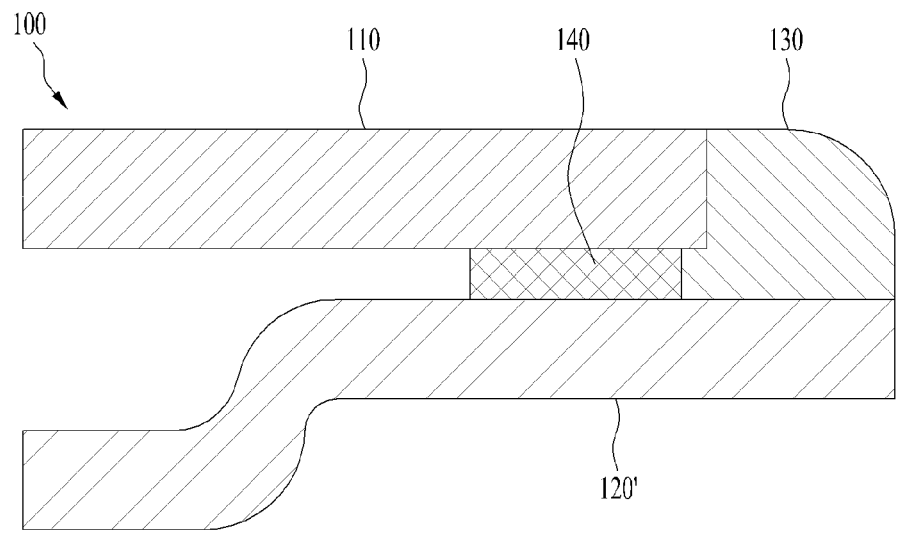

In addition, as in a further embodiment shown in FIG. 4, the back cover 120' may have an "S" shape, rather than a "U" shape. In this case, the display panel 110 and the back cover 120' may be fixed through the resin layer 130, and the edge of the display device 100 may be particularly thinned. In addition, the back cover 120' does not protrude or hardly protrudes outwards from the resin layer 130, whereby it is possible to easily provide a slim bezel.

Figure 5:
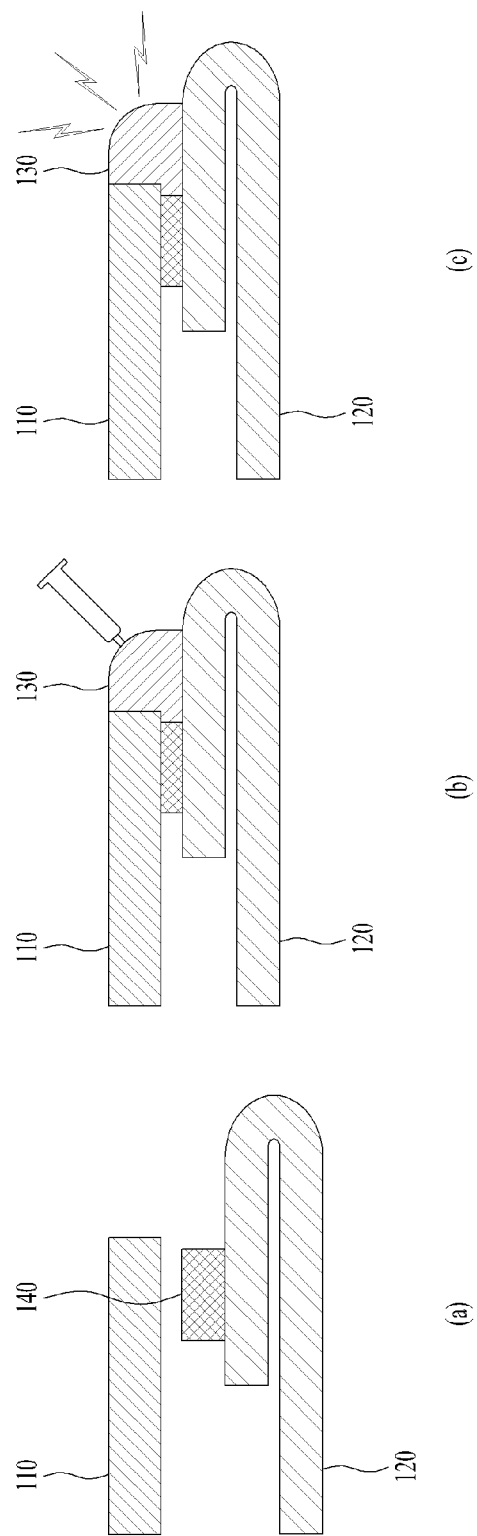
FIG. 5 is a reference view showing a process of manufacturing a resin layer of the display device shown in FIG. 1.

FIG. 5 is a reference view showing a process of manufacturing the resin layer of the display device shown in FIG. 1.

First, as shown in FIG. 5(a), a foam pad or an adhesive layer 140 is placed on a back cover, and a display panel 110 is disposed thereon so as to be aligned therewith. At this time, the foam pad or the adhesive layer 140 may be omitted.

Subsequently, as shown in FIG. 5(b), a resin layer 130 is applied to fix the display panel 110 and the back cover 120, which are aligned with each other. At this time, the direction in which the resin layer 130 is applied may be changed depending on the kind of resin layer 130 or the method of applying the resin layer 130. In addition, the application sequence or direction of the resin layer 130 may be selectively changed. A connection line may be formed as if the connection line were joined to corner parts or connection parts depending on the application sequence or direction of the resin layer 130. The connection line may be removed after hardening of the resin layer 130.

When the application of the resin layer 130 is completed, as shown in FIG. 5(c), the resin layer 130 is hardened. The hardening process may be performed simultaneously with the process of applying the resin layer 130. Alternatively, an UV hardening process may be partially or entirely performed after the application of the resin layer 130. In the hardening process, the hardening time may be set depending on the viscosity of the resin layer, and another hardening process may be performed.

Figure 6:
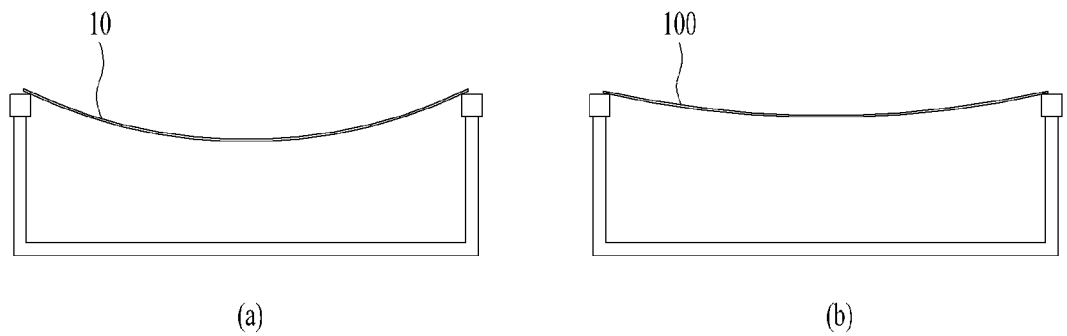
FIGS. 6 and 7 are reference views showing the extent to which the display device shown in FIG. 1 droops.
Figure 7:
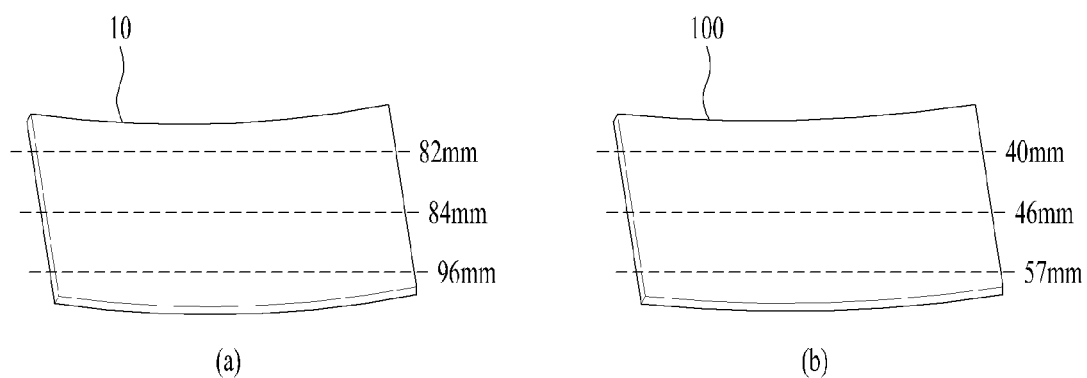

FIGS. 6 and 7 are reference views showing the extent to which the display device shown in FIG. 1 droops.

FIG. 6(a) shows a conventional display device 10, in which the display panel 110 and the back cover 120 are fixed to each other via an adhesive, and FIG. 6(b) shows the display device 100 in which the display panel 110 and the back cover 120 are fixed to each other via the resin layer 130. The products to be compared were tested on the same holder in the same environments.

It can be seen with the naked eye that the extent of drooping of the display device 10 of FIG. 6(a) is greater than the extent of drooping of the display device 100 of FIG. 6(b). The extents to which the display devices droop are numerically compared in detail in FIG. 7.

FIG. 7(a) shows that the extents of drooping of the upper, middle, and lower parts of the display device 10 are 82 mm, 84 mm, and 96 mm, respectively, and FIG. 7(b) shows that the extents of drooping of the upper, middle, and lower parts of the display device 100 are 40 mm, 46 mm, and 57 mm, respectively.

This means that the extent of drooping of the display device 100 according to the present disclosure is at most 60% of the extent of drooping of a conventional display device 10. It can be seen that the extent of drooping of the display device 100 according to the present disclosure is at most half of the extent of drooping of the conventional display device 10 at the parts of the display devices having the greatest extents of drooping.

Consequently, the drooping resistance of the thin-film display device 100 according to the present disclosure is increased by the provision of the resin layer 130. Since the drooping resistance of the display device is increased, the thickness of the back cover 120, which prevents the drooping of the display device, may be reduced, whereby it is possible to realize a thinner and lighter display device 100. Furthermore, since the display panel 110 and the back cover 120 are coupled to each other via the resin layer 130, the introduction of moisture may be prevented due to a sealed structure, whereby the expected lifespan of the display device may be increased. In addition, the resin layer 130 may be easily removed, whereby maintenance expense may be reduced and physical reworking may be easily performed.

Figure 8:
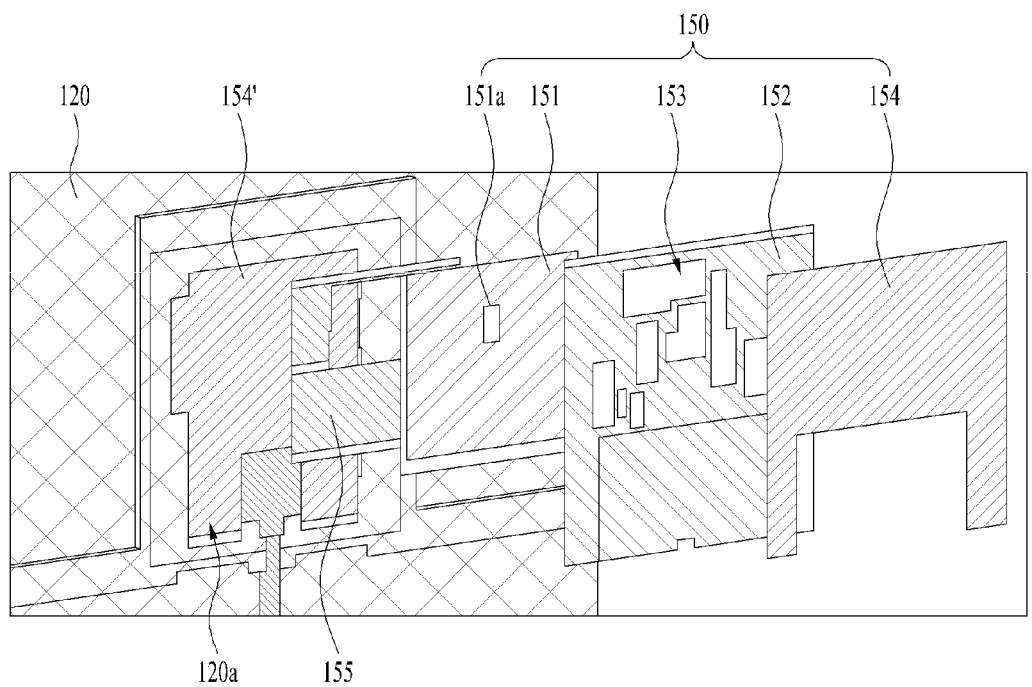
FIG. 8 is an exploded perspective view showing a circuit unit of the display device according to the embodiment of the present disclosure.
Figure 9:
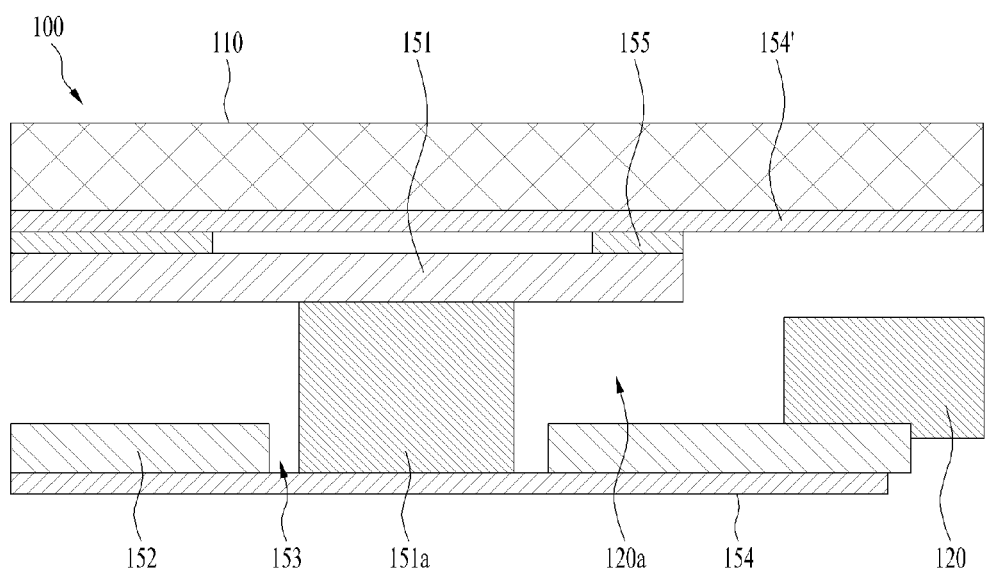
FIG. 9 is a sectional view showing a portion of the circuit unit of the display device shown in FIG. 8.
Figure 10:
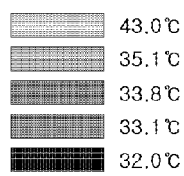
FIG. 10 is a reference view showing the distribution of temperature of the display device shown in FIG. 8.
Figure 10:
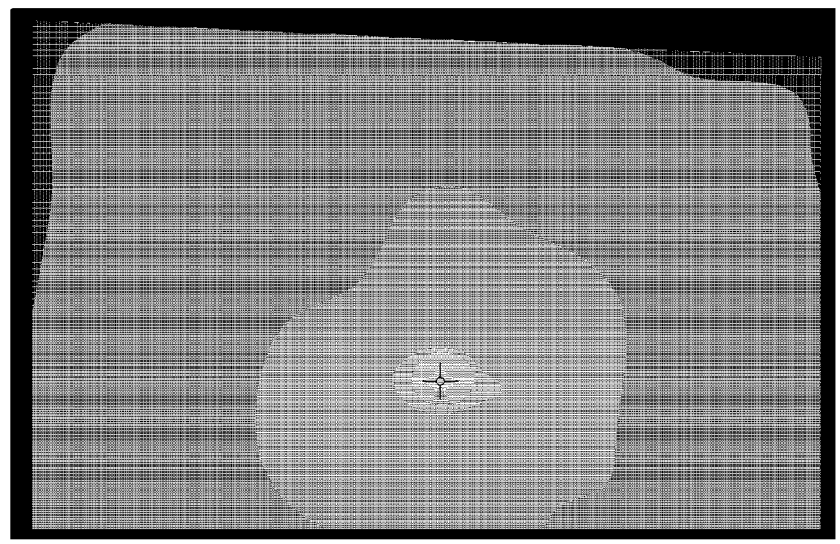
Figure 10:
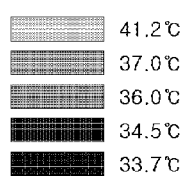
Figure 10:
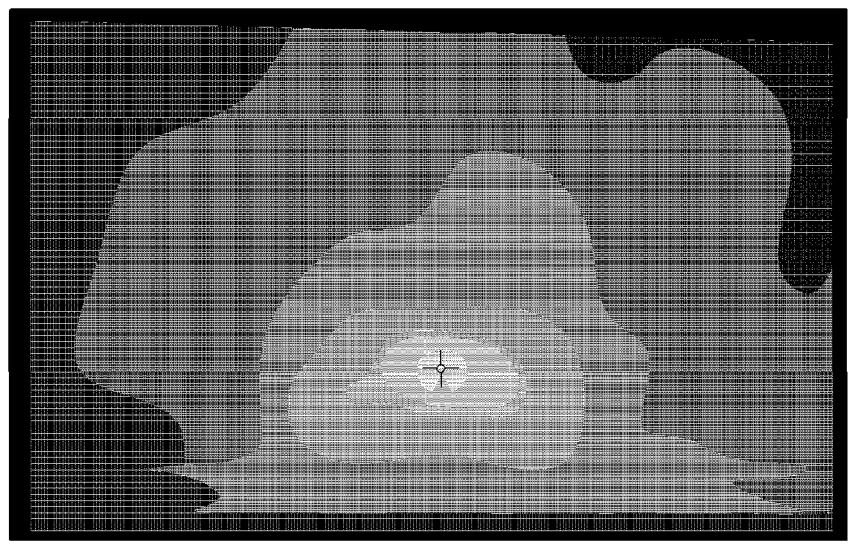

FIG. 8 is an exploded perspective view showing a circuit unit of the display device according to the embodiment of the present disclosure, FIG. 9 is a sectional view showing a portion of the circuit unit of the display device shown in FIG. 8, and FIG. 10 is a reference view showing the distribution of temperature of the display device shown in FIG. 8.

Referring to FIGS. 8 to 10, the display device 110 according to the present disclosure further includes a circuit unit 150.

The circuit unit 150 is connected to the rear surface of the display panel 110, and is disposed so as to correspond to an open area 120a of the back cover 120. Consequently, a portion of the circuit unit 150 may protrude through the open area 120a of the back cover 120.

The circuit unit 150 includes a substrate 151, a cover shield 152, and a graphite part 154.

At least one IC chip 151a is provided on the substrate 151, whereby the substrate 151 has a predetermined thickness. Since the extent to which the thickness of the substrate 151 can be reduced is limited, the structure in which the IC chip is coupled to the substrate 151 or the structure in which the IC chip is disposed on the substrate 151 may be changed in order to reduce the thickness of the substrate 151.

To this end, at least one through-hole 153 is provided in the cover shield 152, which is disposed so as to be adjacent to the substrate 151. The IC chip 151a of the substrate 151 is disposed so as to contact the graphite part 154 via the through-hole 153.

In other words, a graphite part 154' is basically coupled to the rear surface of the display panel 110, and the substrate 151 is coupled to the rear surface of the graphite part 154' together with a PET sheet 155. The PET sheet 155 compensates for a gap between a portion that protrudes from the rear surface of the substrate 151 and a portion that does not protrude from the rear surface of the substrate 151, and couples the substrate 151 to the graphite part 154'. The cover shield 152 is disposed on the substrate 151 so as to be adjacent thereto, and is coupled to the back cover 120. The upper part of the IC chip 151a of the substrate 151 is disposed in the through-hole 153 formed in the cover shield 152. The top surface of the IC chip 151a is disposed so as to contact the inside surface of the graphite part 154, and the graphite part 154 is coupled to the rear surface of the cover shield 152 so as to cover the through-hole 153.

As a result, it is possible to reduce the thickness of the circuit unit 150 in proportion to the thickness of the cover shield 152 that is reduced due to the through-hole 153.

The inner circumferential surface of the through-hole 153 formed in the cover shield 152 and the IC chip 151a may be disposed so as to be spaced apart from each other. Since the top surface of the IC chip 151a contacts the inside surface of the graphite part 154, heat generated from the IC chip 151a is transferred to the periphery via the graphite part 154, whereby heat dissipation is performed. The heat transferred via the graphite part 154 is dissipated by the cover shield 152, which is coupled to the graphite part 154 in tight contact therewith.

The cover shield 152 may be disposed such that the IC chip 151a and the inner circumferential surface of the through-hole 153 are spaced apart from each other on the through-hole 153.

In the conventional art, an additional PET sheet and a gap pad are also coupled to the top surface of the substrate. In contrast, according to the present disclosure, the PET sheet and the gap pad are removed from the top surface of the substrate 151, and the substantial thicknesses of the back cover 120 and the cover shield 152 are also reduced, whereby it is possible to reduce the overall thickness of the circuit unit 150.

It is possible to reduce the thicknesses of the back cover 120 and the cover shield 152, since it is possible to increase the drooping resistance of the display device 100 by the provision of the resin layer 130. Heat dissipation is improved even though the thickness of the cover shield 152 is reduced, since the top surface of the IC chip 151a is disposed so as to directly contact the graphite part 154, whereby the speed at which heat moves is increased.

FIG. 10(a) shows the state in which heat is generated from the conventional display device, and FIG. 10(b) shows the state in which heat is generated from the display device according to the present disclosure.

It can be seen that the temperature shown in FIG. 10(b) is higher than the overall temperature shown in FIG. 10(a). It can be determined that the high temperature results from a decrease in the heat dissipation effect. In contrast, however, it can be seen that the maximum temperature of FIG. 10(b) is 41.2° C., which is lower than 43.0° C. of FIG. 10(a). This means that heat from the center of the heat generation source is transferred to the periphery thereof, whereby the overall temperature is high, but the average temperature variation t is small, whereby heat dissipation efficiency is improved.

As is apparent from the above description, in the display device according to the present disclosure, therefore, the display panel and the back cover are coupled and fixed to each other via the resin layer, whereby it is possible to manufacture a lightweight, thin display device having a slim bezel while increasing the drooping resistance of the display device.

In addition, since the drooping resistance of the display device is increased, it is possible to reduce the thickness of the back cover, whereby it is possible to further reduce the weight of the display device.

Furthermore, the through-hole is formed in the cover shield such that a portion of the upper part of the IC chip of the substrate can be inserted into the through-hole, with the result that the coupling structure of the circuit unit is improved, whereby it is possible to further reduce the thickness of the display device.

It will be apparent to those skilled in the art that various modifications and variations can be made in the present disclosure without departing from the spirit or scope of the disclosure. Thus, it is intended that the present disclosure covers such modifications and variations of this disclosure provided they come within the scope of the appended claims and their equivalents.

What is claimed is:

1. A display device comprising:
   a display panel;
   a back cover coupled to a rear surface of the display panel;
   a resin layer provided at an edge of the display panel placed on the back cover for fixing the back cover and the display panel; and
   a pad layer or an adhesive layer interposed between the rear surface of the display panel and a top surface of the back cover,
   wherein the resin layer comprises a fault part disposed between the display panel and the back cover in a state of being bent inwards at least once, wherein the resin layer contacts the pad or the adhesive layer.

2. The display device according to claim 1, wherein the back cover is provided in a surface thereof to which the resin layer is applied with at least one application groove.

3. The display device according to claim 1, wherein the resin layer has a height that is equal to or higher than a height of a top surface of the display panel.

4. The display device according to claim 1, further comprising:
   a circuit unit provided in an open area formed in a portion of the back cover, wherein the circuit unit comprises:
   a substrate connected to the display panel, the substrate having at least one IC chip mounted therein;
   a cover shield fixed to the back cover for dissipating heat from the substrate; and
   a graphite part coupled to an outside of the cover shield in tight contact therewith.

5. The display device according to claim 4, wherein the cover shield is provided with a through-hole, through which a portion of the at least one IC chip extends.

6. The display device according to claim 5, wherein the cover shield is disposed such that the at least one IC chip and an inner circumferential surface of the through-hole are spaced apart from each other on the through-hole.

7. The display device according to claim 5, wherein the graphite part is disposed so as to contact a top surface of the at least one IC chip extending through the through-hole.

8. A display device comprising:
   a display panel;
   a back cover coupled to a rear surface of the display panel; and
   a circuit unit provided in an open area formed in a portion of the back cover, wherein the circuit unit comprises:
   a substrate connected to the display panel, the substrate having at least one IC chip mounted therein;
   a cover shield fixed to the back cover for dissipating heat from the substrate; and
   a graphite part coupled to an outside of the cover shield in contact therewith,
   wherein the cover shield is provided with a through-hole, through which a portion of the at least one IC chip extends,
   wherein the graphite part directly contacts a top surface of the at least one IC chip extending through the through-hole.

9. The display device according to claim 8, wherein the cover shield is disposed such that the at least one IC chip and an inner circumferential surface of the through-hole are spaced apart from each other on the through-hole.

* * * * *